(12) United States Patent
Balch et al.

(10) Patent No.: US 9,082,875 B2
(45) Date of Patent: Jul. 14, 2015

(54) METHODS FOR NORMALIZING STRAIN IN SEMICONDCUTOR DEVICES AND STRAIN NORMALIZED SEMICONDUCTOR DEVICES

(71) Applicant: International Business Machines Corporation, Armonk, NY (US)

(72) Inventors: Bruce Balch, Saranac, NY (US); Kerry Bernstein, Underhill, VT (US); John Joseph Ellis-Monaghan, Grande Isle, VT (US); Nazmul Habib, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 126 days.

(21) Appl. No.: 13/647,538

(22) Filed: Oct. 9, 2012

(65) Prior Publication Data
US 2013/0032894 A1 Feb. 7, 2013

Related U.S. Application Data

(62) Division of application No. 12/622,464, filed on Nov. 20, 2009, now Pat. No. 8,298,876.

(51) Int. Cl.
*H01L 27/088* (2006.01)
*H01L 21/8238* (2006.01)
*H01L 29/78* (2006.01)

(52) U.S. Cl.
CPC .... *H01L 21/823807* (2013.01); *H01L 29/7843* (2013.01)

(58) Field of Classification Search
CPC ......... H01L 29/76; H01L 29/94; H01L 27/01; H01L 27/12; H01L 31/0392; H01L 31/113; H01L 31/119; H01L 23/58; H01L 27/092
USPC ................ 257/401, 369, 351, 371, 649, 635
See application file for complete search history.

(56) References Cited

U.S. PATENT DOCUMENTS

| | | | |
|---|---|---|---|
| 6,982,465 B2 | 1/2006 | Kumagai et al. |
| 7,300,891 B2 | 11/2007 | Masonobu et al. |
| 7,358,166 B2 | 4/2008 | Agnello et al. |
| 7,365,357 B2 | 4/2008 | Atanackovic et al. |
| 7,384,861 B2 | 6/2008 | Mehta et al. |
| 7,432,553 B2 | 10/2008 | Chen et al. |
| 7,517,816 B2 | 4/2009 | Frohberg et al. |

(Continued)

OTHER PUBLICATIONS

Ghani, T., et al., a 90 nm High Volume Manufacturing Logic Technology Featuring Novel 45 nm Gate Length Strained Silicon CMOS Transistors, IEDM Tech. Dig., pp. 978-980, 2003; retrieved from the Internet on Aug. 31, 2011 at http://www.stanford.edu/class/ee311/NOTES/Intel%20Strained-Si-IEDM03.pdf.

(Continued)

*Primary Examiner* — Chuong A Luu
(74) *Attorney, Agent, or Firm* — Schmeiser, Olsen & Watts; Anthony J. Canale (57) ABSTRACT

A method of normalizing strain in semiconductor devices and normalized strain semiconductor devices. The method includes: forming first and second field effect transistors of an integrated circuit; forming a stress layer over the first and second field effect transistors, the stress layer inducing strain in channel regions of the first and second field effect transistors; and selectively thinning the stress layer over at least a portion of the second field effect transistor.

14 Claims, 8 Drawing Sheets

(56) References Cited

U.S. PATENT DOCUMENTS

| | | |
|---|---|---|
| 7,521,307 B2 | 4/2009 | Zhu et al. |
| 7,785,950 B2 | 8/2010 | Fang et al. |
| 7,792,663 B2 | 9/2010 | Ikoma et al. |
| 7,948,063 B2 | 5/2011 | Mitani |
| 2004/0075148 A1 | 4/2004 | Kumagai et al. |
| 2005/0263825 A1 | 12/2005 | Frohberg et al. |
| 2006/0157795 A1 | 7/2006 | Chen et al. |
| 2007/0105299 A1 | 5/2007 | Fang et al. |
| 2007/0252214 A1 | 11/2007 | Zhu et al. |
| 2007/0252230 A1* | 11/2007 | Zhu et al. ............ 257/499 |
| 2008/0054314 A1* | 3/2008 | Frohberg et al. ...... 257/288 |
| 2008/0070357 A1 | 3/2008 | Chen et al. |
| 2008/0077378 A1 | 3/2008 | Ikoma et al. |
| 2008/0206943 A1 | 8/2008 | Chen et al. |
| 2008/0251853 A1 | 10/2008 | Chen et al. |
| 2009/0108335 A1 | 4/2009 | Hohage et al. |
| 2009/0194819 A1 | 8/2009 | Zhu et al. |
| 2009/0206410 A1 | 8/2009 | Mitani |
| 2010/0244132 A1 | 9/2010 | Balch et al. |

OTHER PUBLICATIONS

Office Action (Mail Date Feb. 15, 2012) for U.S. Appl. No. 12/622,464, filed Nov. 20, 2009; Confirmation No. 4388.

Amendment filed May 4, 2012 in response to Office Action (Mail Date Feb. 15, 2012) for U.S. Appl. No. 12/622,464, filed Nov. 20, 2009; Confirmation No. 4388.

Notice of Allowance (Mail Date Jul. 26, 2012) for U.S. Appl. No. 12/622,464, filed Nov. 20, 2009; Confirmation No. 4388.

* cited by examiner

METHODS FOR NORMALIZING STRAIN IN SEMICONDCUTOR DEVICES AND STRAIN NORMALIZED SEMICONDUCTOR DEVICES

RELATED APPLICATIONS

This Application is a division of U.S. patent application Ser. No. 12/622,464 filed on Sep. 20, 2009, now U.S. Pat. No. 8,298,876, issued Oct. 30, 2012.

FIELD OF THE INVENTION

The present invention relates to the field of semiconductor devices; more specifically, it relates methods for normalizing strain in semiconductor devices and strain normalized semiconductor devices.

BACKGROUND OF THE INVENTION

It can be appreciated that stress layers can generate strain in semiconductor devices that change the mobility characteristics of semiconductor devices. However, for various reasons, stress layers can produce performance mismatches between devices. Accordingly, there exists a need in the art to mitigate the deficiencies and limitations described hereinabove.

SUMMARY OF THE INVENTION

A first aspect of the present invention is a method, comprising: forming first and second field effect transistors of an integrated circuit; forming a stress layer over the first and second field effect transistors, the stress layer inducing strain in channel regions of the first and second field effect transistors; and selectively thinning the stress layer over at least a portion of the second field effect transistor.

A second aspect of the present invention is a method, comprising: determining spatial relationships between design shapes of selected levels of a design of field effect transistors of an integrated circuit; generating an estimate of strains that would be induced in channel regions of the field effect transistors by a stress layer formed over the field effect transistors based on the spatial relationships; generating a stress layer photomask based on the design shapes of the selected design levels and the estimate of strains; and using the stress layer photomask, selectively thinning the stress layer over at least a portion of one of the field effect transistors.

A third aspect of the present invention is a structure, comprising: first and second field effect transistors of an integrated circuit; and a stress layer having an integral first region having a first thickness over the first field effect transistor and an integral second region having a second thickness over the second field effect transistor, the first region of the stress layer inducing a first amount of strain in a channel region of the first field effect transistor and the second region of the stress layer inducing a second amount of strain in a channel region of the second field effect transistor; and wherein, the first thickness is greater than the second thickness.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

Stress is a measure of the average amount of force exerted per unit area. Stress is a measure of the intensity of the total internal forces acting within a body across imaginary internal surfaces, as a reaction to external applied forces and body forces. Strain is the geometrical expression of deformation caused by the action of stress on a physical body.

In n-channel field effect transistors (NFETs), the mobility of the majority carriers, electrons, is greater (hole mobility is less) when the channel is in tensile stress in the direction of current flow In p-channel field effect transistors (PFETs) the mobility of the majority carriers, holes, is greater than (electron mobility is less) when the channel region is in compressive stress in the direction of current flow. Increasing the mobility of majority carriers increase the performance of the device.

Figure 1:
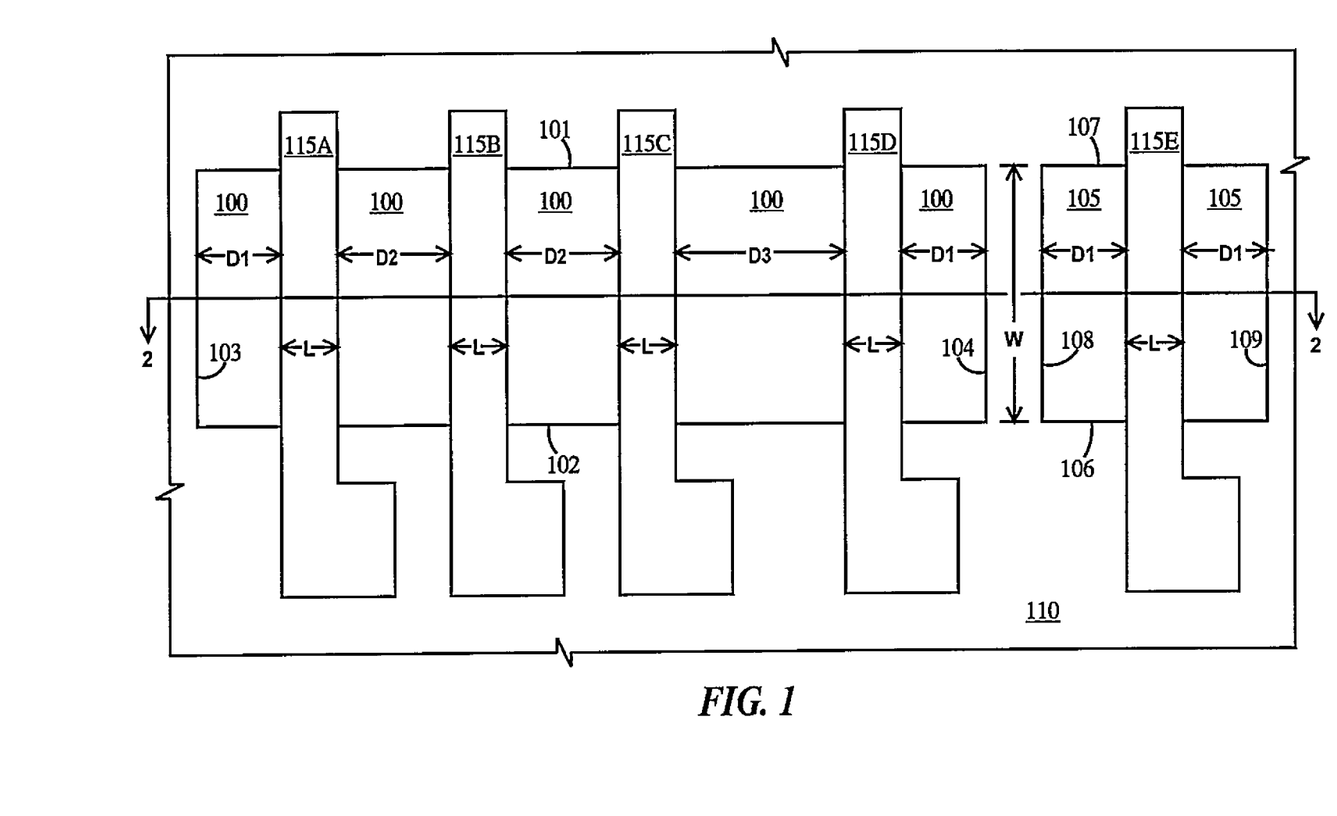
FIG. 1 is a plan view of exemplary field effect transistors (FETS) of an integrated circuit (IC) after preliminary fabrication steps according to embodiments of the present invention.

FIG. 1 is a plan view of exemplary FETs of an IC after preliminary fabrication steps according to embodiments of the present invention. Some structures (illustrated in FIG. 2) are not shown in FIG. 1 for clarity. In FIG. 1, a silicon region 100 having opposite first and second sides 101 and 102 and opposite third and fourth sides 103 and 104 and a silicon region 105 having opposite first and second sides 106 and 107 and opposite third and fourth sides 108 and 109 are surrounded by dielectric isolation 110. Gate electrodes 115A, 115B, 115C and 115D extend (in the present example, perpendicularly, other angles are possible) across silicon region 100 crossing first and second sides 102 and 103 of silicon region 100 and a gate electrode 115E extends (in the present example, perpendicularly, other angles are possible) across silicon region 105 crossing first and second sides 106 and 107 of silicon region 105. Both silicon regions 100 and 105 have a width W. Gate electrodes 115A and 115D are spaced distances D1 from respective third and fourth sides 103 and 104 of silicon region 100. Gate electrodes 115A and 115B are spaced apart a distance D2, gate electrodes 115B and 115C are spaced apart distance D2 and gate electrodes 115C and 115D are spaced apart a distance D3. Gate electrode 115E is spaced distance D1 from third and fourth edges 108 and 109 of silicon region 105. D3 is greater than D2 and D2 is greater than D1. In the example of FIG. 1, gate electrodes 115A, 115B, 115C, 115D and 115E each have a width L. In one example gate electrodes 115A, 115B, 115C, 115D and 115E comprise polysilicon. Because common integrated circuit design systems use design levels and design level shapes it is most convenient to measure distances between shapes in various design levels (e.g., the dielectric isolation shapes and the gate electrode shapes) and base/adjust stress models and strain calculations on plan view distances (e.g., D1, D2 and D3). While strain is a function of the amount of stress over an area, when L and W are the same the values of D1, D2 and D3 outputs of models and calculation can be in terms of D1, D2 and D3 reducing design time.

Figure 2:
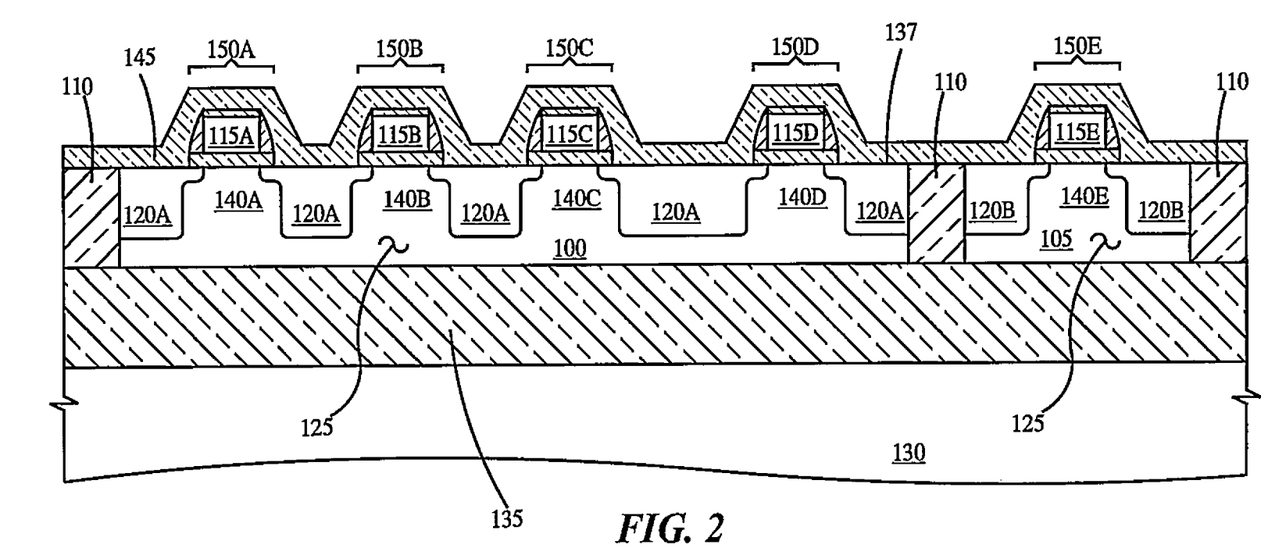
FIG. 2 is a cross-section through line 2-2 of FIG. 1 illustrating additional structures not shown in FIG. 1.

FIG. 2 is a cross-section through line 2-2 of FIG. 1 illustrating additional structures not shown in FIG. 1. In FIG. 2, source/drains 120A have been formed in silicon region 100 on opposites sides of gate electrodes 115A, 115B, 115C and 115D and source/drains 120B have been formed in silicon region 105 on opposite sides of gate electrode 115E. From FIG. 2 it is seen that silicon regions 100 and 105 are regions of a single-crystal silicon layer 125 separated from a supporting substrate 130 (e.g., single-crystal silicon) by a buried oxide (BOX) layer 135. Dielectric isolation 110 extends from a top surface 137 of silicon layer 125 to BOX layer 135. Silicon layer 125, substrate 130 and BOX layer 135 comprise a silicon-on-insulator (SOI) substrate. However, the embodiments of the present invention may be practiced on conventional bulk single-crystal silicon substrates. Channel regions 140A, 140B, 140C and 140D are bounded by source/drains 120A under respective gate electrodes 115A, 115B, 115C and 115D. A channel region 140E is bounded by source/drains 120B under gate electrode 115E. A stress layer 145 has been formed on dielectric isolation 110, regions of silicon layer 125 not covered by gate stacks 150A, 150B, 150C, 150D and 150E and on gate stacks 150A, 150B, 150C, 150D and 150E. It is possible to have thin intervening layers between the stress layer 145 and dielectric isolation 110, silicon layer 125 and gates stacks 150A, 150B, 150C, 150D and 150E so long as those intervening layers to not prevent stress in stress layer 145 from inducing strain in silicon layer 125. In one example, stress layer 145 comprises silicon nitride. It should be understood from FIG. 2, that certain individual source/drains 120A are shared between two adjacent field effect transistors. D1, D2, D3, L and W define spatial relationships of interest between dielectric isolation 110 and gate electrodes 115A, 115B, 115C, 115D and 115E.

Figure 2A:
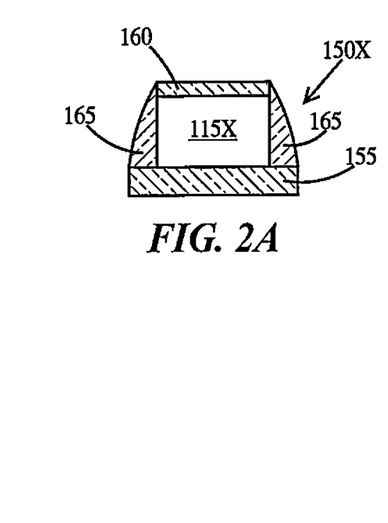
FIG. 2A is a detailed view of gate stacks illustrated in FIG. 2.

FIG. 2A is a detailed view of gate stacks 150A, 150B, 150C, 150D and 150E illustrated in FIG. 2. In FIG. 2A, X represents A, B, C, D or E. In FIG. 2A, gate stack 150X comprises a gate dielectric layer 155, gate electrode 115X on gate dielectric layer 155, a dielectric capping layer 160 on gate electrode 115X and optional dielectric sidewall spacers 165 on opposite sides of gate electrode 115X.

Returning to FIG. 2, when silicon layer 125 is doped P-type and source/drains 120A and 120B are doped N-type (the FETs are NFETs) stress layer 145 in internal tensile stress and induces tensile strain into channel regions 140A, 140B, 140C, 140D and 140E. When silicon layer 125 is doped N-type and source/drains 120A and 120B are doped P-type (the FETs are PFETs) stress layer 145 is in internal compressive stress and induces compressive strain into channel regions 140A, 140B, 140C, 140D and 140E.

Returning to FIG. 1, it is useful to understand how the different clear widths of silicon regions 100 and 105 as denoted by distances D1, D2 and D3 can arise. In one example, the widths are too small to allow intervening shapes. In one example intervening shapes are not allowed. Fill shapes are regularly added to CMOS designs in order to make polygon shape density more uniform. Fill shapes are structures made concurrently with other real shapes (i.e., shapes that generate structures that are part of the physical integrated circuit like gate electrodes 115A, 115B, 115C, 115D and 115E, but are not electrically connected to any other fill shape or real shape in the same fabrication level or normally to any fill shapes or real shapes in other fabrication levels. Uniform shape density is desired in order to achieve tighter dimensional tolerances on real shapes. Fill shapes are intrusive however, and can produce unanticipated effects because they are introduced late in the design process, after most of the electrical modeling and simulation is complete. For that reason, in some sensitive analog designs, such as current minors and voltage-controlled oscillators, blocking shapes are added to actually prevent the later insertion of fill shapes in that immediate region of sensitive circuit shapes. In one example, the area (of distance D3) between gate electrodes 115C and 115D may have initially included fill shapes (e.g., dielectric isolation fill shapes) in the design, but were removed in later stages of the design process.

As mentioned supra, the strain induced by stress layer 145 (see FIG. 2) in any given portion of silicon regions 100 and 105 is a function of the surface area of the source/drains directly under (assuming an intervening layer) or contacting the stress layer and the thickness of the stress layer. The thinner the stress layer the less stress is applied to the silicon layer. Given a uniform thickness of stress layer 145 (see FIG. 2), the larger the surface area, the less stress is transferred to the silicon region because the surface more easily deforms releasing some stress. Consequently, the strain in channel regions of stressed FETs becomes a function of the surface area of source/drains on either side of the channel regions and decreases with increasing surface area. Ignoring sidewall spacers 165 (see FIG. 2A), in FIG. 1, those portions of silicon regions 100 and 105 having an exposed surface area of W×D1, are under the highest relative stress. Those portions of silicon regions 100 having an area of W×D3 are under the lowest relative stress. Those portions of silicon regions 100 having an area of W×D2 are under a relative medium stress (between the highest and lowest relative stresses).

Referring to FIGS. 1 and 2, the particular spatial relationships of gate electrodes 115A, 115B, 115C, 115D and 115E relative to each other and the boundaries of trench isolation 110 were selected for demonstrating the effect surface area on strain over a range of spatial combinations. The strain induced in channel region 140A is from a high stress region of surface area (W×D1) on a first side in combination with a medium stress region of surface area (W×D2) on a second side. The strain induced in channel region 140B is from medium stress regions of surface area (W×D2) on both first and second sides. The strain induced in channel region 140C is from a medium stress region of surface area (W×D2) on a first side in combination with a low stress region of surface area (W×D3) on a second side. The strain induced in channel region 140D is from a low stress region of surface area (W×D3) on a first side in combination with a high stress region of surface area (W×D1) on a second side. The strain induced in channel region 140E is from high stress regions of surface areas (W×D1) on both first and second sides. It should be understood, given transistors with equal W, the stress reducing area becomes a function of the distances D1, D2 and D3. The embodiments of the present invention normalize the strain and majority carrier mobility in channel regions 140A, 140B, 140C, 140D and 140E by reducing the thickness of stress layer 145 over selected source/drain regions.

Figure 3:
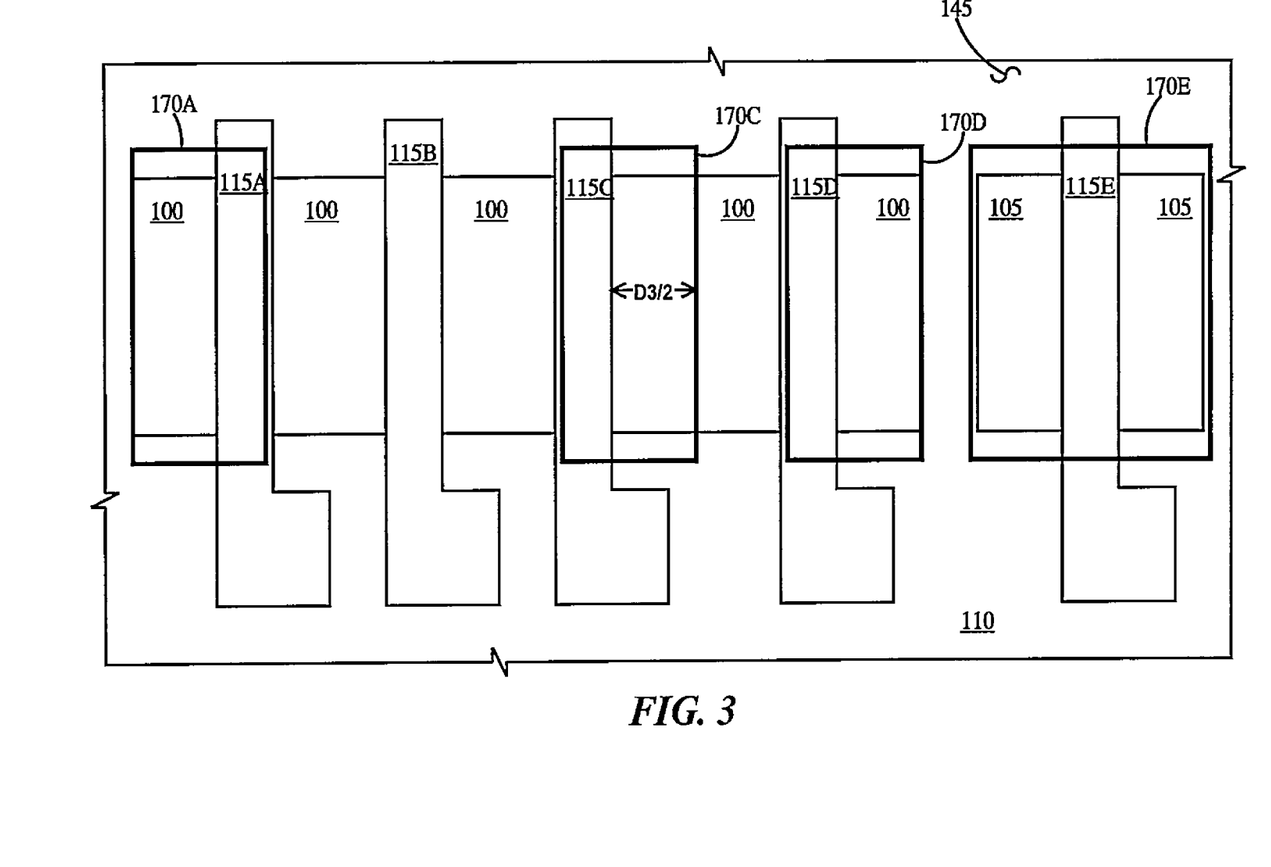
FIG. 3 is plan view of FIG. 1 with photomasks images according to embodiments of the present invention superimposed thereon.
Figure 6:
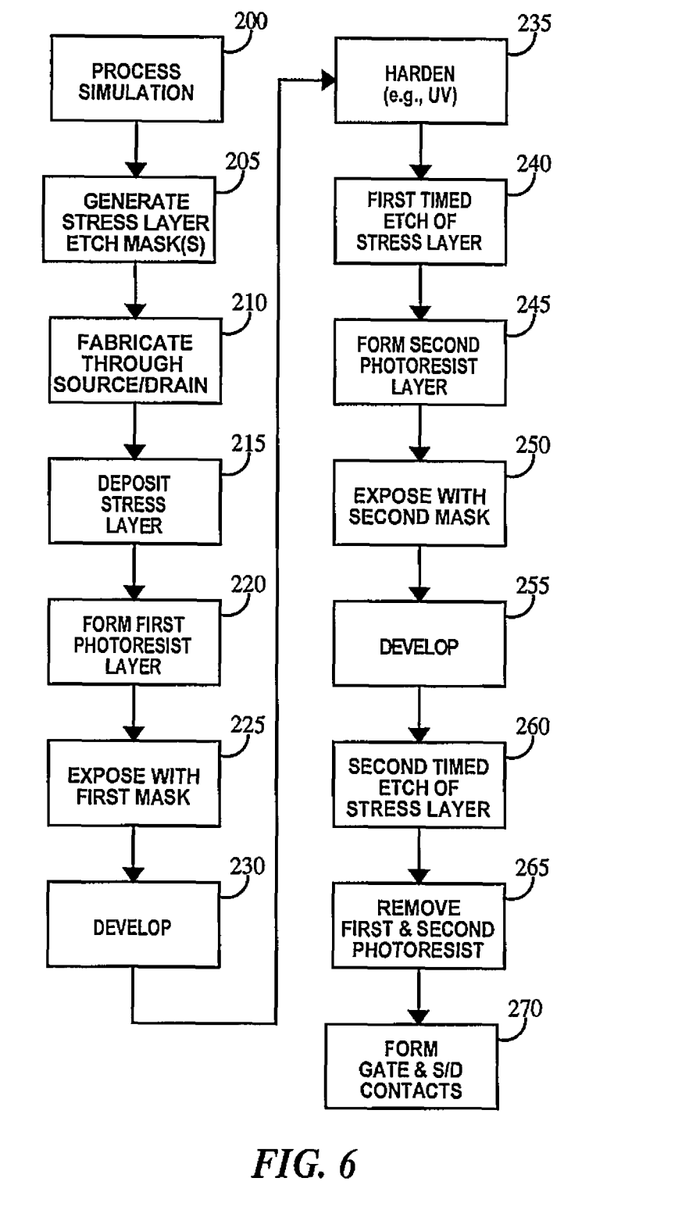
FIG. 6 is a flowchart of an exemplary method of fabricating FETs according to embodiments of the present invention.

FIG. 3 is plan view of FIG. 1 with photomasks images according to embodiments of the present invention superimposed thereon. Source/drains 120A and 120B and sidewall spacers 165 of FIG. 2 are not shown in FIG. 3 for clarity. In FIG. 3, photomask shapes 170A, 170C, 170D and 170E when used in combination allow selective thinning of regions of stress layer 145 within the heavy outline boxes so the strain in channel regions 140A, 140C, 140D and 140E (see FIG. 2) are normalized to that of channel region 140B (see FIG. 2). In the present example, two masks are used, the first photomask contains all shapes 170A, 170C, 170D and 170E. The second photomask contains only shape 170E. In the example of FIG. 3, photomask shape 170C extends halfway from gate electrode 115C toward gate electrode 115D, which is a distance D3 divided by 2. This process is illustrated in FIG. 6 and described infra.

Figure 4:
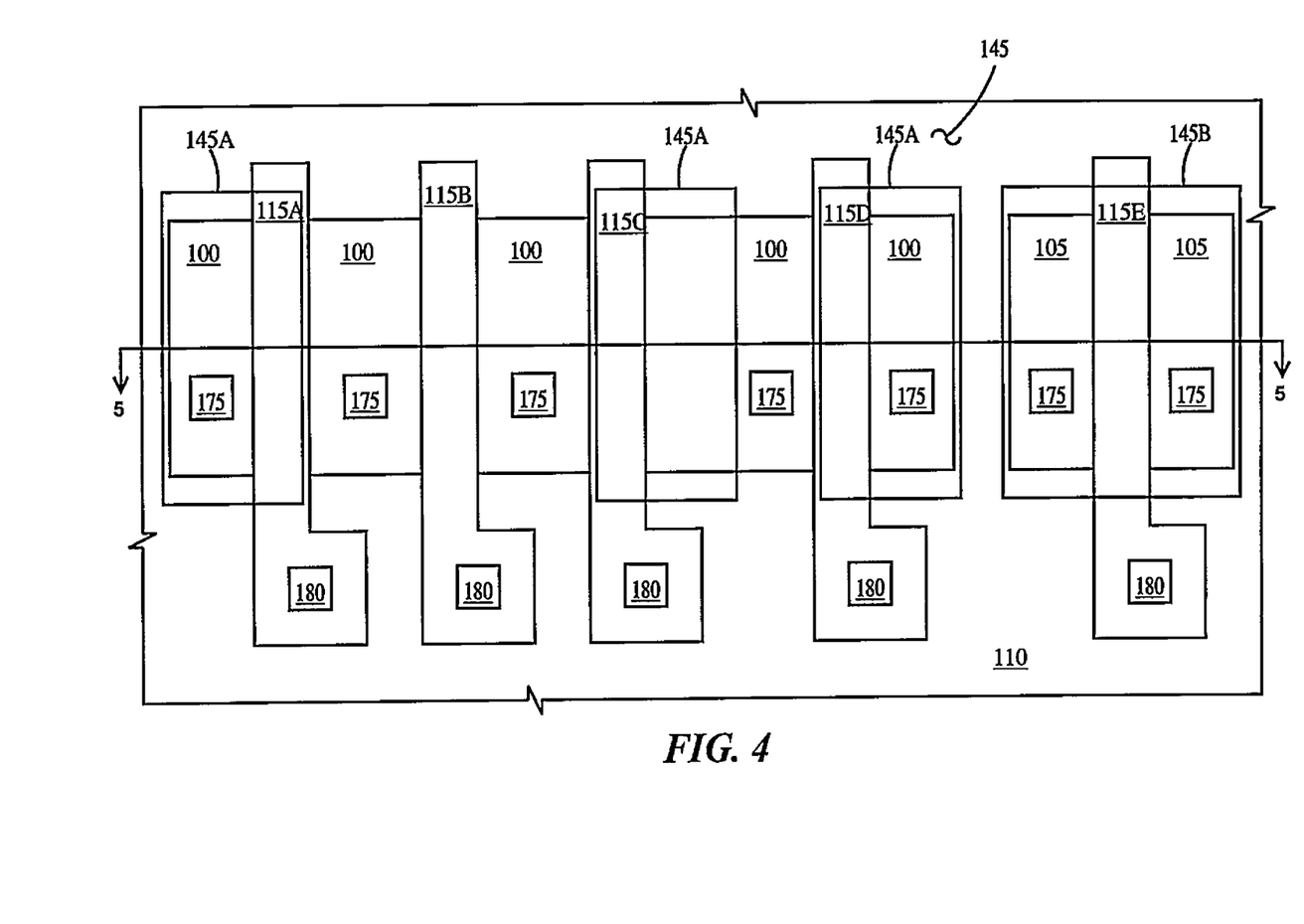
FIG. 4 is a plan view of exemplary FETs of the IC after further fabrication steps according to embodiments of the present invention.
Figure 5:
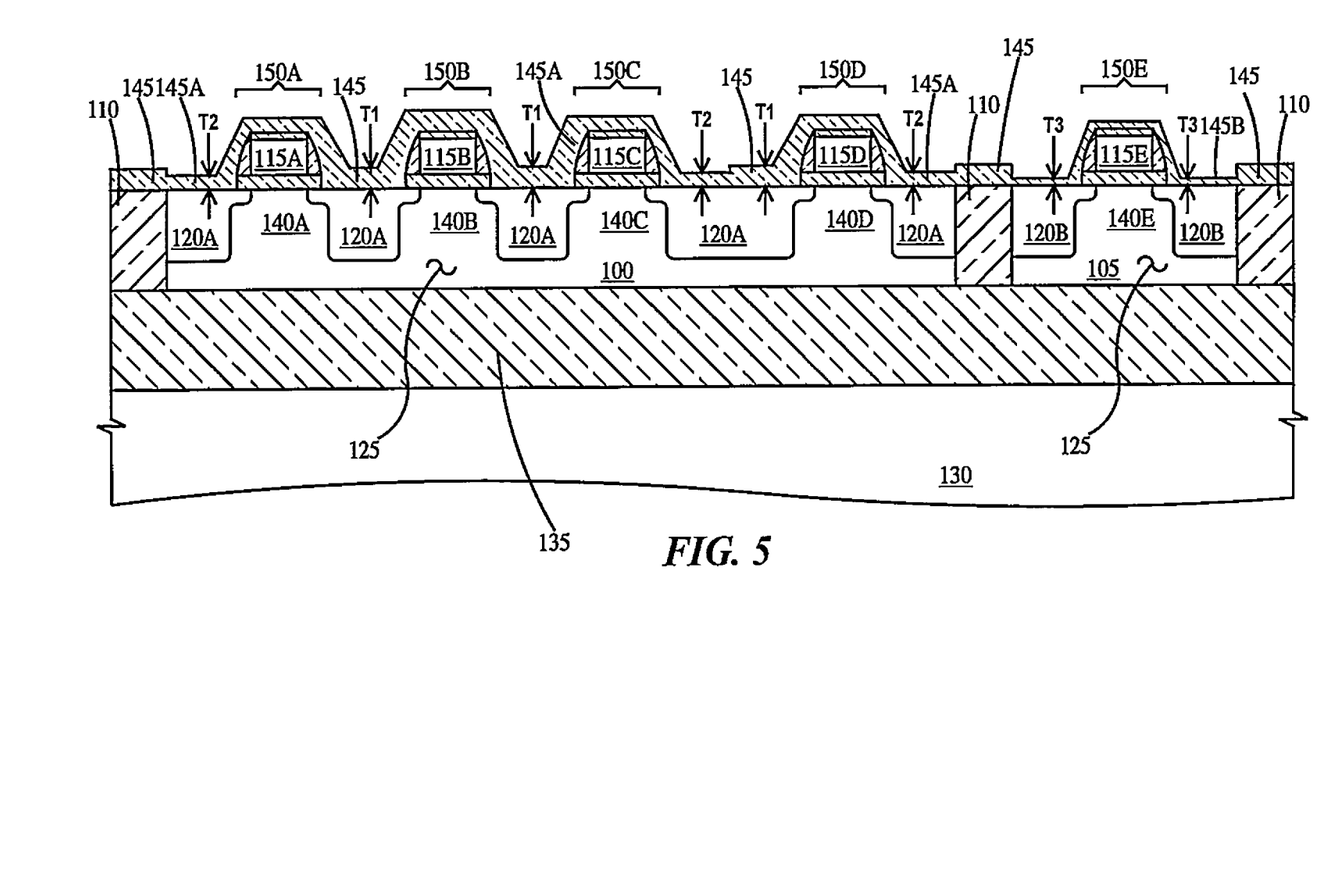
FIG. 5 is a cross-section through line 5-5 of FIG. 4 illustrating additional structures not shown in FIG. 4.

FIG. 4 is a plan view of exemplary FETs of the IC after further fabrication steps according to embodiments of the present invention and FIG. 5 is a cross-section through line 5-5 of FIG. 4 illustrating additional structures not shown in FIG. 4. Source/drains 120A and 120B and sidewall spacers 165 of FIG. 2 are not shown in FIG. 4 for clarity but are shown in FIG. 5. If the original thickness of stress inducing layer 145 was T1, after photolithographic and etch steps, regions 145A of stress layer are reduced by to a thickness T2 and regions 145B of stress reducing layer 145 are reduced to a thickness T3, where T1 is greater than T2 and T2 is greater than T3. T1, T2 and T3 are illustrated in FIG. 5. In FIG. 4, source/drain contacts 175 and gate electrode contacts 180 are formed through remaining thicknesses of stress layer 145. While stress layer 145 is illustrated as being selectively thinned over gate electrodes 115A, 115C, 115D and 115E, it is principally the selective thinning of stress layer 145 over silicon regions 100/105 (more, specifically over the source/drain regions) adjacent to one side of gate stacks 150A, 150C, 150D and both sides of gate stack 150E that has the most effect on reducing strain in the channel regions 140A, 140C, 140D and 140 E (see FIG. 5). Stress layer 145 has not been thinned over regions of silicon layer 100 adjacent to one side of gate stacks 150A, 150C and 150D and adjacent to both sides of gate stack 115B. Stress layer 145 has been thinned over a portion of silicon layer 100 adjacent to gate stack 115C and not thinned over the remaining portion of silicon layer between gates stacks 150C and 150D.

The goal of selective thinning of stress 145 is to either (i) reduce the differences in strain (or majority carrier mobility) between channel regions 115A, 115B, 115C, 115D and 115E, (ii) reduce the strain (or majority carrier mobility) in channel regions 115A, 115C, 115D and 115E to be about the same and as the strain (or majority carrier mobility) in channel region 115B, (iii) make the strain (or majority carrier mobility) in channel regions 115A, 115B, 115C, 115D and 115E about the same, or (iv) combinations thereof. While two sets of photomask shapes and three levels of strain normalization corresponding to thickness T1, T2 and T3 have been described, there may be a few as one photomask shape and two levels of strain normalization or more than two sets of photomask shapes and more than three levels of strain normalization. It should also be understood that 5 channel regions have been illustrated in FIGS. 1, 2, 3, 4 and 5 in order to show application of the invention to combinations of gate electrode/dielectric isolation geometries, but may be applied to a pair of FETs. Also the FETs need not have the same values for L and W (see FIG. 1).

By selective adjustment of strain and majority carrier mobility according to the embodiments of the present invention, FETs that otherwise would have the same strain and majority carrier mobility can be fabricated that have different strain and majority carrier mobility. Thus the FETs would "turn-on" at slightly different times. For example, a latch could be fabricated using the embodiments of the present invention that would "come up" to the same known state upon "power up."

FIG. 6 is a flowchart of an exemplary method of fabricating FETs after according to embodiments of the present invention. In step 200, process simulations using FETs of interest are performed. In one example the simulation captures the influence on channel strain as a function of stress layer thickness. Transconductance is related to carrier mobility, which is a function of strain. This simulation provides stress layer thickness data and can be translated into etch times for the stress layer etch steps 240 and 260 described infra. The simulation data is also used to determine the stress layer mask shapes. In step 205, stress layer etch photomasks are generated (see FIG. 7 and discussion infra). In step 210, an integrated circuit is fabricated through source/drain level as illustrated in FIG. 2. In step 215, the stress layer is formed on the on the integrated circuit. In step 220, a first photoresist layer is formed on the integrated circuit. In step 225, the first photoresist layer is exposed using the first photomask containing photomask shapes 170A, 170C, 170D and 170E (see FIG. 3). In step 230, the first photoresist layer is developed to form a first patterned photoresist layer with regions of the stress layer exposed in openings in the first patterned photoresist layer. In step 235, the first patterned photoresist layer is "hardened" for example by exposing the layer to UV radiation. This step is not required in alternative photolithographic processes that either use one photomask or strip the first photoresist layer before applying a second photoresist layer. In step 240, a timed etch is performed to, for example, through 25% of the thickness of the stress layer. In step 245 a second photoresist layer is applied over the first patterned photoresist layer. The "hardening" prevents the first patterned photoresist layer from dissolving in the second photoresist layer. In step 250, the second photoresist layer is exposed using the second photomask containing photomask shape 170E (see FIG. 3) or a slightly larger version of photomask shape 170E. In step 255, the second photoresist layer is developed to form a second patterned photoresist layer with some regions of the stress layer exposed in openings in the second photoresist layer that align with openings in the first patterned photoresist layer. In step 260, a timed etch is performed to, for example, through an additional 25% to 50% of the original thickness of the stress layer. In step 265 the first and second patterned photoresist layers are removed and in step 270 contacts are formed through remaining thicknesses of the stress layer to the source/drains and gate electrodes. Additional fabrication steps, such as forming wiring levels and terminal interconnects are then performed.

Figure 7:
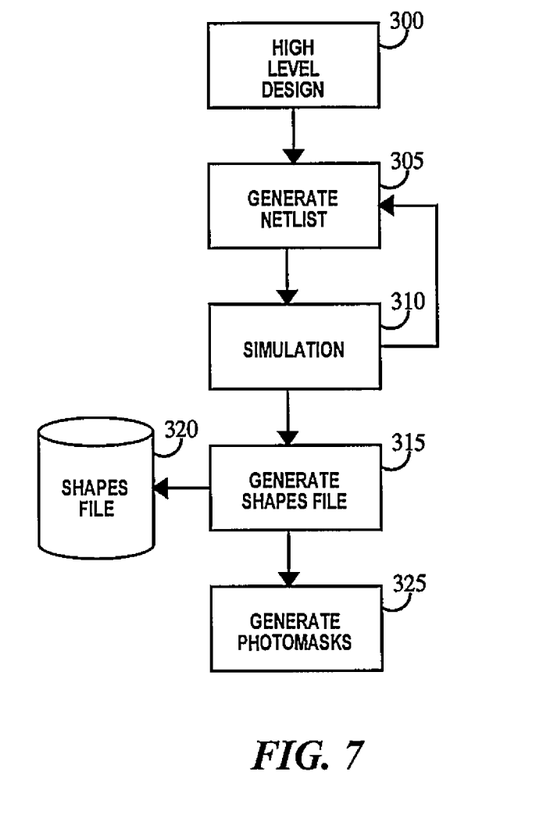
FIG. 7 a flowchart of a simplified design methodology according to embodiments of the present invention.

FIG. 7 a flowchart of a simplified design methodology according to embodiments of the present invention. In step 300 a high level circuit design is generated in, for example high definition language (HDL). In step 305 a netlist is generated. In step 310 design simulations, timing simulation etc. are performed. The netlist is modified by the loop back to step 305. Looping is continued until the design meets specification. In step 315 a shapes file 320 is generated. Shapes file 320 is organized by photomask level and includes "real" shapes, fill shapes and blocking shapes. The stress layer photomask shapes are also generated in step 315. In step 325, the shapes file is used to fabricate actual photomasks.

Generating stress layer photomask shapes involves (1) modeling and simulation of a completed circuit design followed by adding fill shapes and blocking shapes (shapes that prevent placement of fill shapes but do not appear on photomasks) and (2) generating stress layer etch shapes using the dielectric isolation level design shapes, the gate electrode design shapes, rules governing where to place stress layer etch shapes and data from the process modeling of step 200 of FIG. 6. The plan view locations of stress layer shapes may be performed using a pattern perimeter density mapping tool. Pattern perimeter density is defined as the quotient of the perimeter of all shapes in a defined region of the integrated circuit chip (e.g., the entire chip, a region of the chip, etc.) divided by the area of the defined region. This is the same tool used to place fill shapes. Rules governing where to place stress layer shapes may be in the form of a lookup table or algorithm dimensions using source/drain extension from gate electrode distances (e.g., D1, D2 and D3, see FIG. 1) or using source/drain surface areas.

Figure 8:
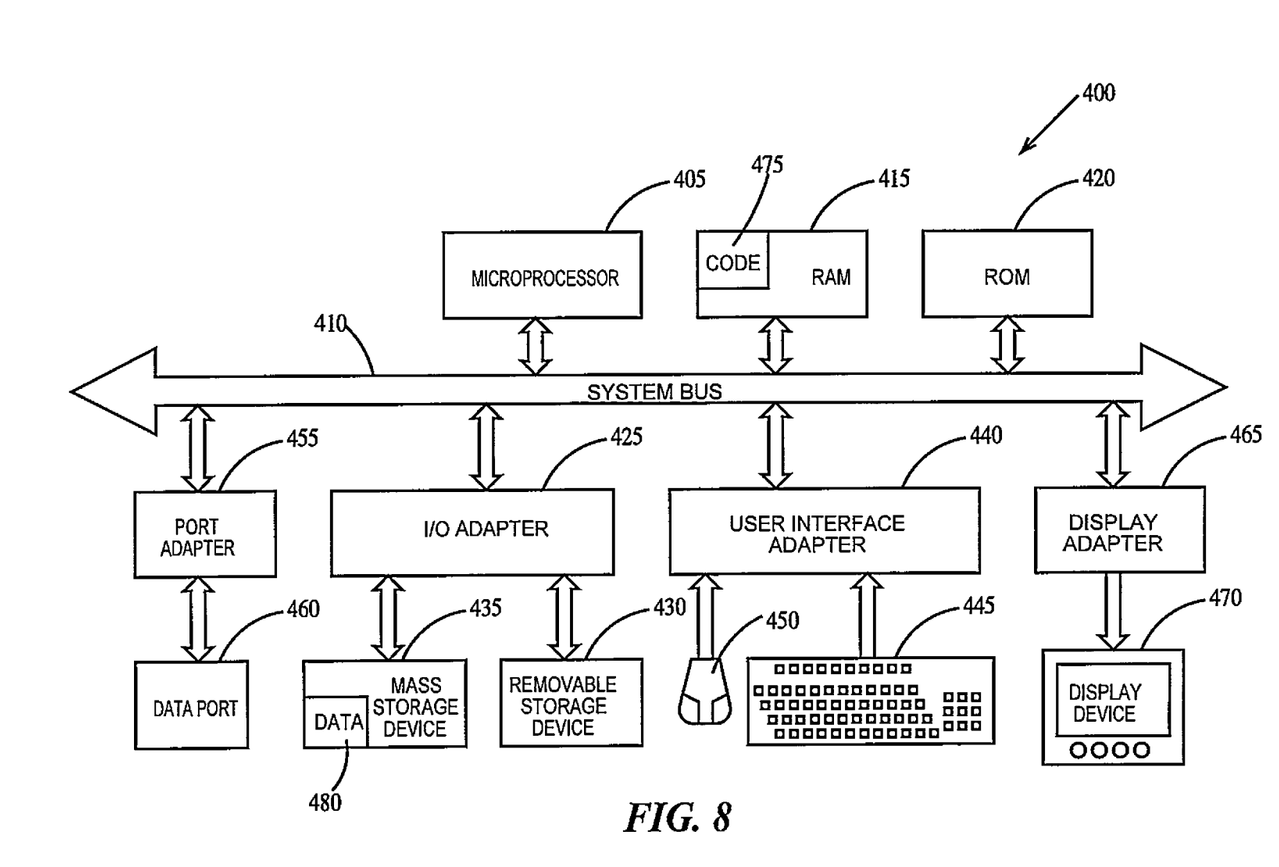
FIG. 8 is a schematic block diagram of a general purpose computer for practicing certain steps of the embodiments of the present invention.

FIG. 8 is a schematic block diagram of a general purpose computer for practicing certain steps of the embodiments of the present invention. Generally, the method described herein with respect to steps 200 and 205 of FIG. 6 and steps 300, 305, 310 and 315 of FIG. 7 are practiced with a computer may be coded as a set of instructions on removable or hard media for use by the computer.

In FIG. 8, computer 400 has at least one microprocessor or central processing unit (CPU) 405. CPU 405 is interconnected via a system bus 410 to a random access memory (RAM) 415, a read-only memory (ROM) 420, an input/output (I/O) adapter 425 for a connecting a removable data and/or program storage device 430 and a mass data and/or program storage device 435, a user interface adapter 440 for connecting a keyboard 445 and a mouse 450, a port adapter 455 for connecting a data port 460 and a display adapter 465 for connecting a display device 470. The tester may be connected to computer system 400 through an additional port adapter 455.

ROM 420 contains the basic operating system for computer 400. The operating system may alternatively reside in RAM 415 or elsewhere as is known in the art. Examples of removable data and/or program storage device 630 include magnetic media such as floppy drives and tape drives and optical media such as CD ROM drives. Examples of mass data and/or program storage device 435 include electronic, magnetic, optical, electromagnetic, infrared, and semiconductor devices. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD. In addition to keyboard 445 and mouse 450, other user input devices such as trackballs, writing tablets, pressure pads, microphones, light pens and position-sensing screen displays may be connected to user interface 440. Examples of display devices include cathode-ray tubes (CRT) and liquid crystal displays (LCD).

A computer program with an appropriate application interface may be created by one of skill in the art and stored on the system or a data and/or program storage device to simplify the practicing of this invention. In operation, information for or the computer program created to run the present invention is loaded on the appropriate removable data and/or program storage device 430, fed through data port 460 or typed in using keyboard 445.

Thus, the embodiments of the present invention provide a system and methods for modulating stress layers in the fabrication of semiconductor devices and provide strain normalized semiconductor devices.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A structure, comprising:
    first and second field effect transistors of an integrated circuit; and
    a stress layer having an integral first region having a first thickness over said first field effect transistor and an integral second region having a second thickness over said second field effect transistor, said first region of said stress layer inducing a first amount of strain in a channel region of said first field effect transistor and said second region of said stress layer inducing a second amount of strain in a channel region of said second field effect transistor;
    wherein, said first thickness is greater than said second thickness;
    wherein said stress layer is formed directly on a source and a drain of said first field effect transistor and a source and a drain of said second field effect transistors.

2. The structure of claim 1, wherein a difference between said first and second amounts of strain is less than a difference between third and fourth amounts of strain that would induced respectively in said channel regions of said first and second field effect transistors if said first and second thickness were the same.

3. The structure of claim 1, wherein said first and second amounts of strain are about the same.

4. The structure of claim 1, wherein mobilities of majority carriers in channel regions of said first and second field effect transistors are different and a mobilities of majority carriers in said channel regions of respective third and fourth field effect transistors having a stress layer having said first thickness are about the same, said first and third field effect transistors, except for said thicknesses of said stress layers, being otherwise identical and said second and fourth field effect transistors, except for said thicknesses of said stress layers, being otherwise identical.

5. The structure of claim 1, wherein mobilities of majority carriers in channel regions of said first and second field effect transistors are about the same and a mobilities of majority carriers in said channel regions of respective third and fourth field effect transistors having a stress layer having said first thickness are different, said first and third field effect transistors, except for said thicknesses of said stress layers, being otherwise identical and said second and fourth field effect transistors, except for said thicknesses of said stress layers, being otherwise identical.

6. The structure of claim 1, wherein said first and second field effect transistors comprise P-doped source/drains over opposite sides of corresponding N-doped channel regions, said N-doped channel regions under corresponding gate electrodes separated from said channel regions by corresponding gate dielectric layers, said stress layer under compressive stress.

7. The structure of claim 1, wherein said first and second field effect transistors comprise N-doped source/drains over opposite sides of corresponding P-doped channel regions, said P-doped channel regions under corresponding gate electrodes separated from said channel regions by corresponding gate dielectric layers. said stress layer under tensile stress.

8. The structure of claim 1, further including:
a third field effect transistor;
said stress layer having an integral third region having a third thickness over said third field effect transistor, said third region of said stress layer inducing a third amount of strain in a channel region of said third field effect transistor; and
wherein, said third thickness is different from first thickness and said second thickness.

9. The structure of claim 8, wherein said first amount of strain, said second amount of strain and said third amount of strain are about the same.

10. The structure of claim 1, wherein:
said first field effect transistor has a first source/drain having a first surface area on a first side of a first gate electrode and a second source/drain having a second surface area on a second side of said first gate electrode;
said second field effect transistor has a third source/drain having a third surface area on a first side of a second gate electrode and a fourth source/drain having a fourth surface area on a second side of said second gate electrode;
said first and second surface areas are greater respectively than said third and fourth surface areas; and
said stress layer has a first thickness over said first and second source/drain and a second thickness over said third and fourth source/drains, said first thickness greater than said second thickness.

11. The structure of claim 1, wherein:
said first field effect transistor has a first source/drain having a first surface area on a first side of a first gate electrode and a second source/drain having a second surface area on a second side of said first gate electrode;
said second field effect transistor has a third source/drain having a third surface area on a first side of a second gate electrode and a fourth source/drain having a fourth surface area on a second side of said second gate electrode;
each of said first, second and fourth surface areas are greater than said third surface area; and
said stress layer has a first thickness over said first, second and fourth source/drains a second thickness over said third source/drain, said first thickness greater than said second thickness.

12. The structure of claim 1, wherein:
said first field effect transistor has a first source/drain having a first surface area on a first side of a first gate electrode and a second source/drain having a second surface area on a second side of said first gate electrode;
said second field effect transistor has a third source/drain having a third surface area on a first side of a second gate electrode and a fourth source/drain having a fourth surface area on a second side of said second gate electrode;
each of said first, second and third surface areas are less than said fourth surface area; and
said stress layer has a first thickness over said first, second and third source/drains a less than whole portion of said fourth source/drain and a second thickness over a remaining portion of said fourth source/drain, said first thickness greater than said second thickness.

13. A structure of comprising:
first and second field effect transistors of an integrated circuit; and
a stress layer having an integral first region having a first thickness over said first field effect transistor and an integral second region having a second thickness over said second field effect transistor, said first region of said stress layer inducing a first amount of strain in a channel region of said first field effect transistor and said second region of said stress layer inducing a second amount of strain in a channel region of said second field effect transistor;
wherein, said first thickness is greater than said second thickness; and
wherein only a single dielectric layer intervenes between said stress layer and a source and a drain of said first field effect transistor and a source and a drain of said second field effect transistor.

14. A structure, comprising:
first and second field effect transistors of an integrated circuit; and
a stress layer having an integral first region having a first thickness over said first field effect transistor and an integral second region having a second thickness over said second field effect transistor, said first region of said stress layer inducing a first amount of strain in a channel region of said first field effect transistor and said second region of said stress layer inducing a second amount of strain in a channel region of said second field effect transistor;
wherein, said first thickness is greater than said second thickness;
wherein said first field effect transistor has a first source/drain having a first surface area on a first side of a first gate electrode and a second source/drain having a second surface area on a second side of said first gate electrode;
wherein said second field effect transistor has a third source/drain having a third surface area on a first side of a second gate electrode and a fourth source/drain having a fourth surface area on a second side of said second gate electrode; and
(i) said first and second surface areas are greater respectively than said third and fourth surface areas; and
said stress layer has a first thickness over said first and second source/drain and a second thickness over said third and fourth source/drains, said first thickness greater than said second thickness; or
(ii) each of said first, second and fourth surface areas are greater than said third surface area; and
said stress layer has a first thickness over said first, second and fourth source/drains a second thickness over said third source/drain, said first thickness greater than said second thickness; or
(iii) each of said first, second and third surface areas are less than said fourth surface area; and
said stress layer has a first thickness over said first, second and third source/drains a less than whole portion of said fourth source/drain and a second thickness over a remaining portion of said fourth source/drain, said first thickness greater than said second thickness.

* * * * *